United States Patent
Nishi et al.

(10) Patent No.: US 8,590,450 B2
(45) Date of Patent: Nov. 26, 2013

(54) CLEANING APPARATUS AND SCREEN PRINTING APPARATUS

(75) Inventors: Eiichi Nishi, Tokyo (JP); Muneyoshi Numao, Saitama (JP)

(73) Assignee: Sony Corporation, Tokyo (JP)

( * ) Notice: Subject to any disclaimer, the term of this patent is extended or adjusted under 35 U.S.C. 154(b) by 383 days.

(21) Appl. No.: 12/736,810

(22) PCT Filed: Apr. 24, 2009

(86) PCT No.: PCT/JP2009/058204
§ 371 (c)(1),
(2), (4) Date: Nov. 12, 2010

(87) PCT Pub. No.: WO2009/150906
PCT Pub. Date: Dec. 17, 2009

(65) Prior Publication Data
US 2011/0061549 A1 Mar. 17, 2011

(30) Foreign Application Priority Data
Jun. 10, 2008 (JP) .................................. 2008-152074

(51) Int. Cl.
*B41F 35/00* (2006.01)
*B05C 17/04* (2006.01)

(52) U.S. Cl.
USPC ............................ 101/425; 101/123; 101/424

(58) Field of Classification Search
USPC .................. 101/123, 129, 423, 425, 124, 424
See application file for complete search history.

(56) References Cited

U.S. PATENT DOCUMENTS

| | | | | |
|---|---|---|---|---|
| 5,197,384 A | * | 3/1993 | Yawata et al. | 101/123 |
| 5,485,781 A | * | 1/1996 | Rovaris | 101/129 |
| 6,036,787 A | * | 3/2000 | Bennett et al. | 134/21 |
| 6,354,199 B2 | * | 3/2002 | Murakami | 101/126 |
| 6,626,106 B2 | * | 9/2003 | Peckham et al. | 101/424 |
| 6,638,363 B2 | * | 10/2003 | Erdmann | 134/9 |
| 6,923,312 B2 | * | 8/2005 | Pham et al. | 198/495 |

(Continued)

FOREIGN PATENT DOCUMENTS

| | | |
|---|---|---|
| JP | 06-297696 | 10/1994 |
| JP | 10-180981 | 7/1998 |

(Continued)

OTHER PUBLICATIONS

International Search Report; Application No. PCT/JP2009/058204; Dated: Jun. 10, 2008.

*Primary Examiner* — Ren Yan
(74) *Attorney, Agent, or Firm* — Rader, Fishman & Grauer PLLC

(57) ABSTRACT

A screen printing apparatus that prevents degradation of a printing tact and print quality is provided. There are included a cleaning unit 14 that cleans one surface 11c of a screen mask 11 opposing a workpiece 2, the screen mask 11 having a print pattern for printing a pattern on the workpiece 2, and a conveying means 15 that conveys the cleaning unit 14 over the surface 11c of the screen mask 11. The cleaning unit 14 includes cleaning paper 21 that contacts the surface 11c of the screen mask 11, a scraper 22 that brings the cleaning paper 21 into contact with the surface 11c of the screen mask 11, that slides on the surface 11c of the screen mask 11 with the cleaning paper 21 being disposed therebetween, and that has an uneven face portion 22b, and a scraper moving means 23 that moves the scraper 22 to the contact position.

5 Claims, 11 Drawing Sheets

(56) References Cited

U.S. PATENT DOCUMENTS 6,955,121 B2 * 10/2005 Perault et al. ............... 101/129
7,017,489 B2 * 3/2006 Perault et al. ............... 101/425
7,024,716 B2 * 4/2006 Murakami ..................... 15/3

FOREIGN PATENT DOCUMENTS

| JP | 11-58678 A | 3/1999 |
| JP | 2001-191501 | 7/2001 |
| JP | 2005-199452 A | 7/2005 |

* cited by examiner

FIG. 2
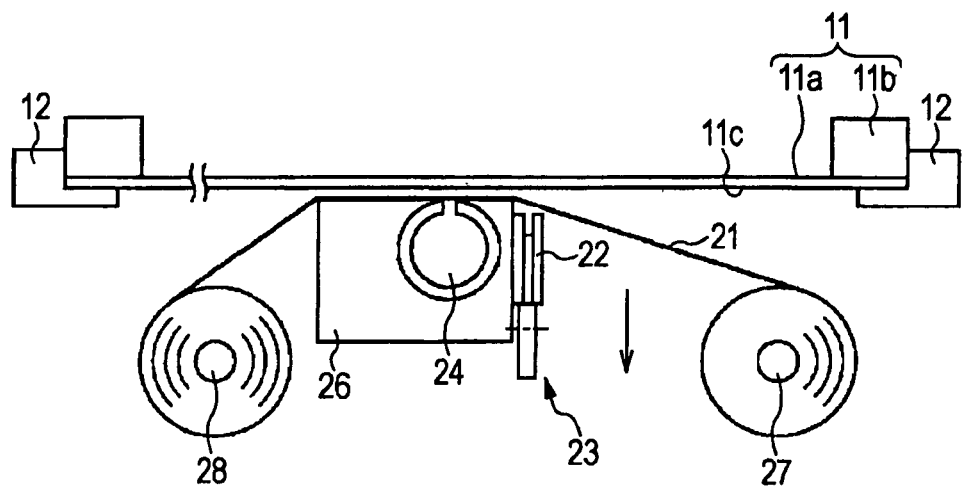
FIG. 2 (A)
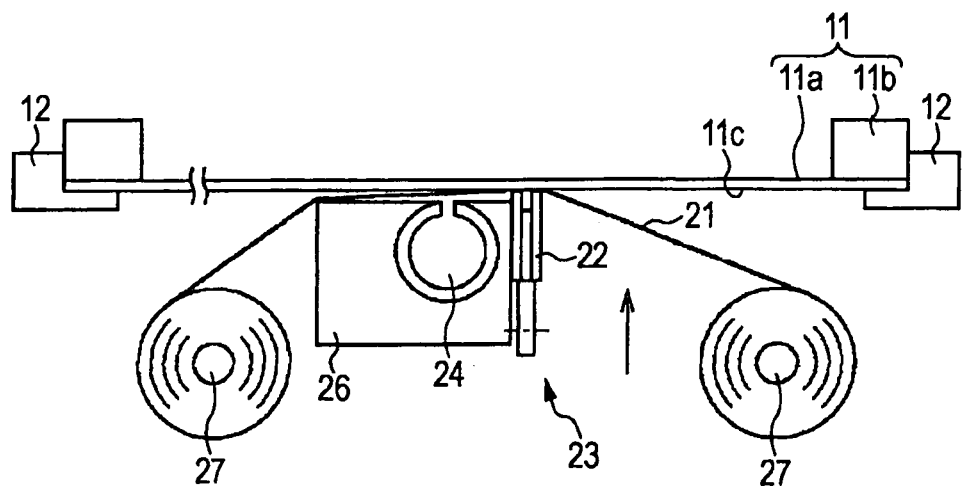
FIG. 2 (B)

FIG. 4
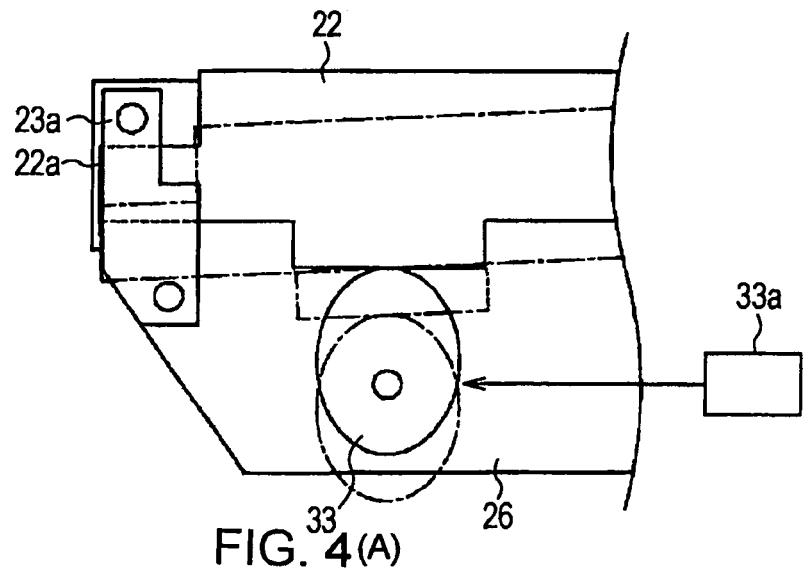
FIG. 4(A)
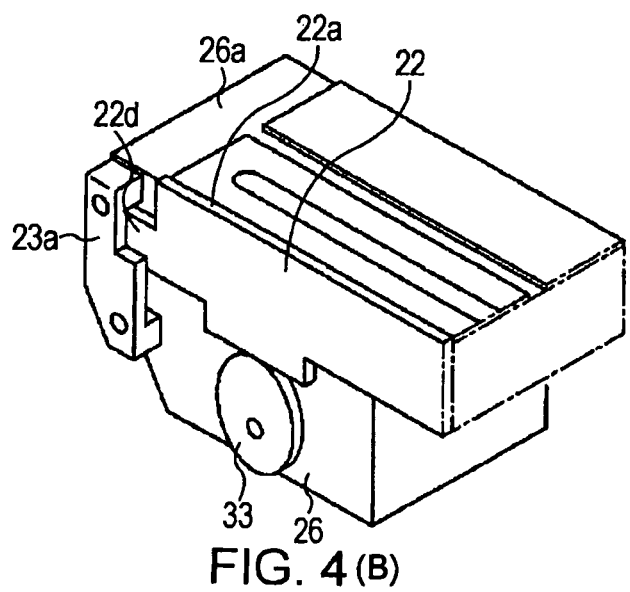
FIG. 4(B)

FIG. 5
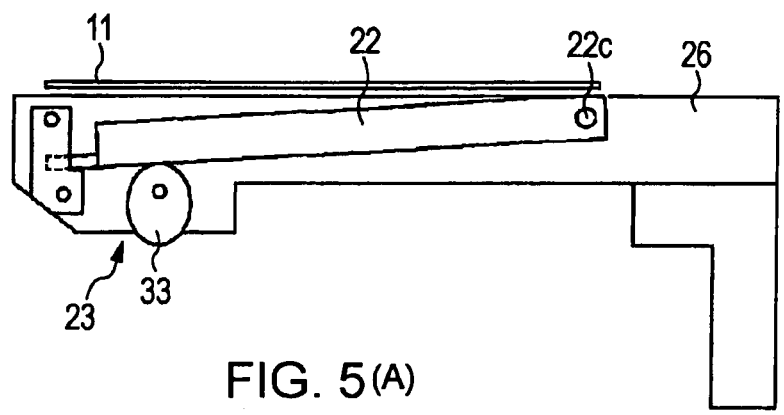
FIG. 5(A)
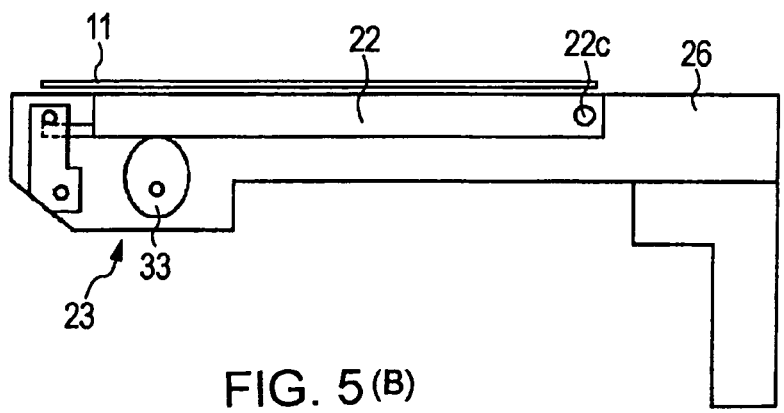
FIG. 5(B)

FIG. 8
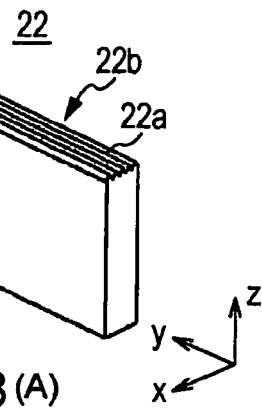
FIG. 8(A)
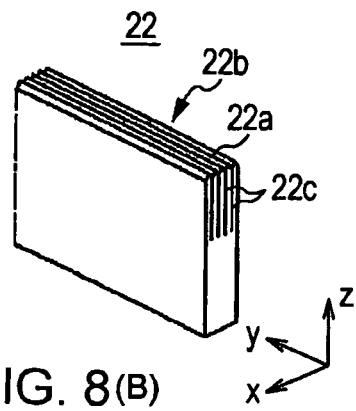
FIG. 8(B)
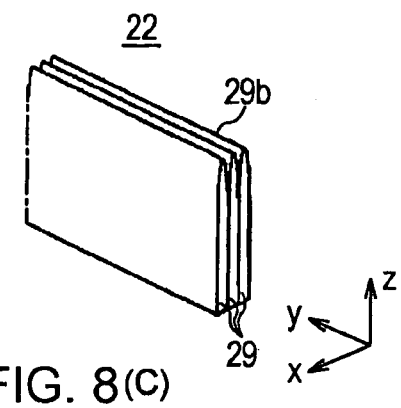
FIG. 8(C)
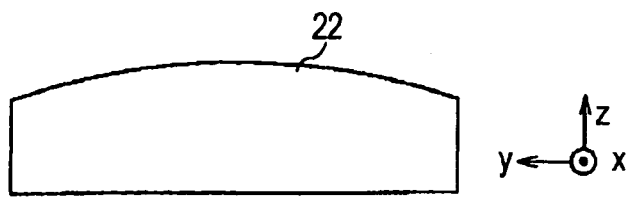
FIG. 8(D)

FIG. 10
FIG. 10(A)
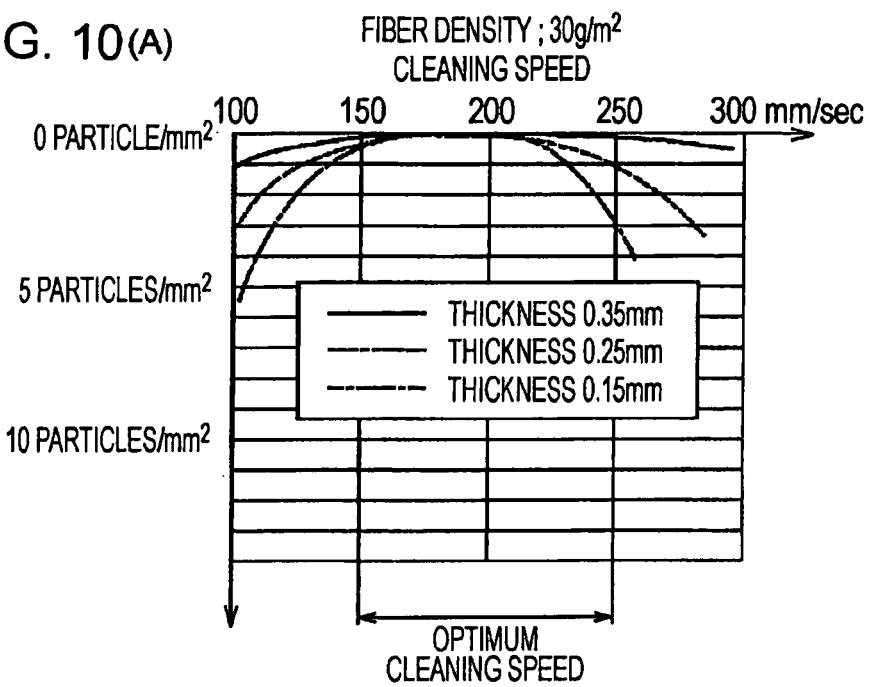
FIG. 10(B)
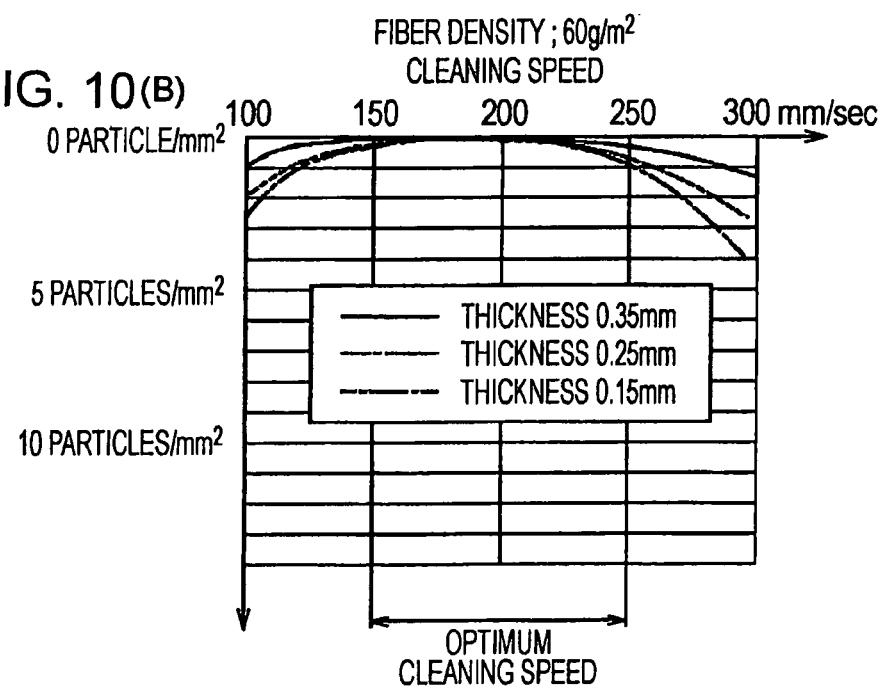

CLEANING APPARATUS AND SCREEN PRINTING APPARATUS

TECHNICAL FIELD

The present invention relates to a cleaning device for use in a screen printing apparatus used for a printed wiring board and the like, and to the screen printing apparatus.

BACKGROUND ART

Screen printing or the like is used in pattern printing, solder resist printing, numbering printing, and through hole printing in a circuit forming process for a printed wiring board, and solder cream printing and exterior (chassis, name plate, operation panel) printing in a mounting process.

A typical printing machine for performing this screen printing performs printing by applying and transferring a pasty material, such as ink or solder paste, onto a printing surface of a printing material via a screen mask on which a print pattern is drawn. That is, a squeegee is slid on the screen mask, whereby the pasty material is transferred and printed on the printing material. Thus, the pasty material is applied on the printing material through an aperture pattern.

In this case, part of the pasty material remains at an aperture of the aperture pattern in the screen mask. This residual pasty material at the aperture leaks out from the aperture, and adheres to a back surface of the screen mask. This leakage occurs particularly when a pasty material having a low viscosity is used, and is a phenomenon in which the residual pasty material drops off from a wall of the aperture because of gravity and flows toward the back surface of the screen mask. If this adhering residual pasty material is transferred on the printing material, defects in the application position and application shape are caused, and in a circuit board, a quality defect, such as a bridge, is caused.

Further, in printing, if the adhesion between the screen mask and a substrate serving as a printing material is low, the pasty material exudes, and this causes a quality defect. FIG. 11 illustrates a substrate serving as a printing material. A plurality of mounted components 101 are mounted on one surface 100a of this substrate 100. Also, on the surface 100a and the other surface 100b of the substrate 100, there are provided copper foils 102 to which electrodes of the mounted components 101 are soldered, resist layers 103 serving as insulating layers, and silk ink layers 104 that are subjected to silk printing for indicating reference numbers or the like of the mounted components 101. When solder paste 105 is printed on this substrate 100 in a predetermined pattern, the substrate 100 is supported by backup pins 106 for preventing the substrate from warping. Then, a screen mask 107 is brought into tight contact with a printing surface (the other surface 100b), and a squeegee 108 is slid on this screen mask 107, whereby the solder paste 105 is transferred and printed. In this case, the surface of the substrate 100 is uneven because of the silk ink layers 105 and the like. When the solder paste 105 is applied on this surface via the screen mask 107, a gap of the order of microns is formed between the screen mask 107 and a printing position on the substrate 100. A phenomenon in which the solder paste 105 exudes into this gap is referred to as exudation. If printing is further performed in a state in which this exudation occurs, defects in application position and application shape and a quality defect, such as a bridge, are caused.

Accordingly, in the screen printing apparatus, it is necessary to timely clean the back surface of the screen mask.

As cleaning mechanisms for the back surface of the screen mask, there are a mechanism using a method in which cleaning paper for wiping the residual pasty material is used and a mechanism using a method in which the pasty material adhering to the back surface of the screen mask is scraped off with a scraper formed by a plate-shaped member, instead of wiping with the paper.

Incidentally, cleaning is necessary to realize high-quality printing. Also, there is a great demand to increase the printing tact. Accordingly, cleaning is performed in every several printing steps to increase the printing tact. This sacrifices quality.

CITATION LIST

Patent Literature

PTL 1: Japanese Unexamined Patent Application Publication No. 2005-199452

SUMMARY OF INVENTION

Technical Problem

Accordingly, the present invention has been made in view of the above circumstances, and an object of the invention is to provide a cleaning device for use in a screen printing apparatus that can perform printing without reducing the printing tact and can prevent degradation of print quality, and the screen printing apparatus.

Solution to Problem

To achieve the above object, a cleaning device according to the present invention includes a cleaning unit that cleans one surface of a screen mask opposing a workpiece, the screen mask having a print pattern for printing a pattern on the workpiece; and conveying means that conveys the cleaning unit from one end to the other end of the surface of the screen mask. Further, the cleaning unit includes cleaning paper that contacts the surface of the screen mask, a scraper that brings the cleaning paper into contact with the surface of the screen mask, that slides on the surface of the screen mask with the cleaning paper being disposed therebetween, and that has an uneven face portion, and scraper moving means that moves the scraper to the contact position.

Advantageous Effects of Invention

In the present invention, the cleaning unit includes the scraper that brings the cleaning paper into contact with one surface of the screen mask, that slides on the surface of the screen mask with the cleaning paper being disposed therebetween, and that has the uneven face portion. Hence, cleaning can be performed at a speed higher than in the conventional cleaning method of performing wiping with the cleaning paper. For this reason, it is possible to realize a printing tact in a shorter time than before. Further, cleaning can be performed in every printing step without reducing the printing tact. This allows high-quality printing to be stably performed without lowering the print quality.

In addition, according to the present invention, since the cleaning paper is slid on the surface of the screen mask with the scraper having the uneven face portion, the amount of paper used in one cleaning step can be reduced.

BRIEF DESCRIPTION OF DRAWINGS

FIGS. 2(A) and 2(B) are schematic views of a cleaning unit, respectively illustrating a state in which a scraper is at a down position and a state in which the scraper is at an up position.

FIGS. 4(A) and 4(B) are a partial plan view of the cleaning unit and a partial perspective view of the cleaning unit, respectively, illustrating a regulation piece for regulating the up-down movement of the scraper of the cleaning unit and an eccentric cam.

FIG. 5 includes schematic plan views illustrating the up-down movement of the scraper of the cleaning unit.

FIG. 8 illustrates other examples of scrapers.

FIGS. 10(A) and 10(B) are views showing the relationship between the cleaning speed and the cleanness, respectively showing a case in which cleaning paper having a fiber density of 30 g/m$^2$ is used and a case in which cleaning paper having a fiber density of 60 g/m$^2$ is used.

DESCRIPTION OF EMBODIMENTS

A specific embodiment of a screen printing apparatus to which the present invention is applied will be described in detail below with reference to the drawings.

Figure 1:
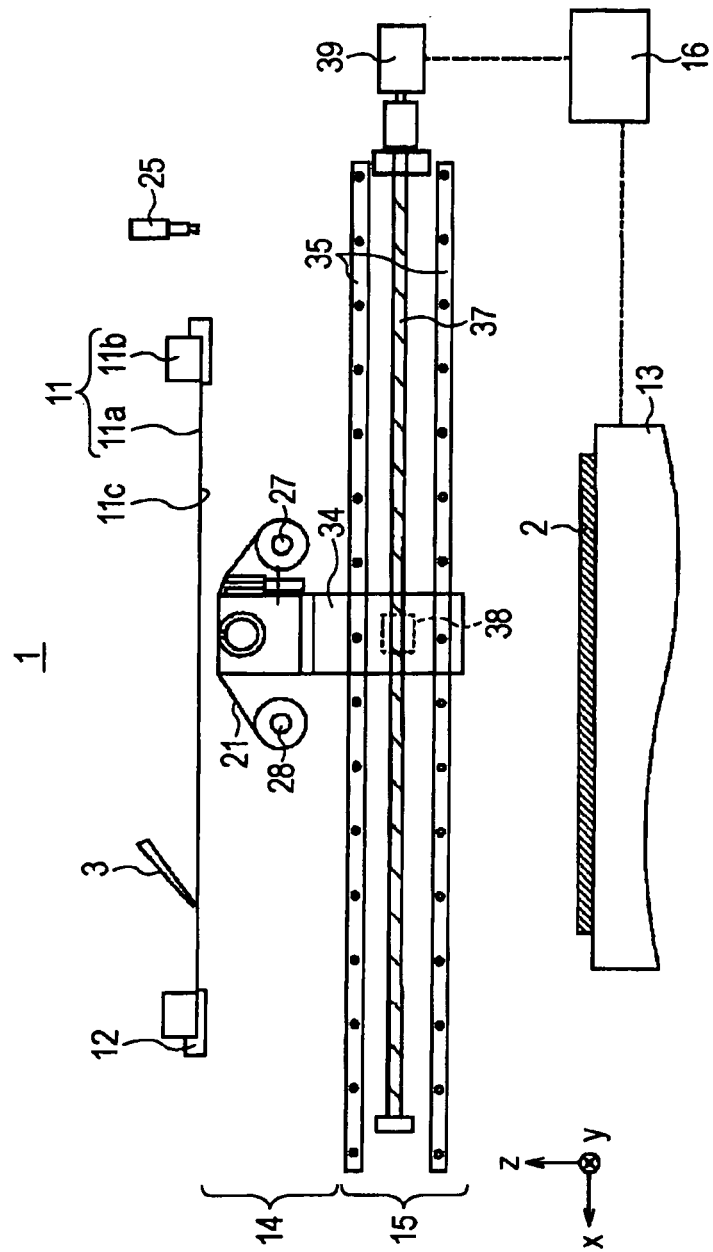
FIG. 1 is a schematic view of a screen printing apparatus to which the present invention is applied, as viewed from the front side.

FIG. 1 is a schematic view of a screen printing apparatus 1 to which the present invention is applied, as viewed from the front side. As illustrated in FIG. 1, the screen printing apparatus 1 includes a screen mask 11 with a print pattern for printing a pattern on a workpiece 2, a screen support portion 12 for supporting the screen mask 11, a stage 13 opposing the screen mask 11 so as to support the workpiece 2, a cleaning unit 14 that is conveyed between the stage 13 and the screen mask 11 so as to clean one surface 11c of the screen mask 11 opposing the workpiece 2, a conveying means 15 for conveying the cleaning unit 14 from one end to the other end of the surface 11c of the screen mask 11, and a control means 16 for controlling operations of the means.

In the screen printing apparatus 1, the relative position between the workpiece 2 and the screen mask 11 is adjusted by an unillustrated alignment means, and a pasty material, such as ink or solder paste, is applied, transferred and printed onto the workpiece 2 serving as a printed wiring board via the screen mask 11 on which a print pattern is drawn. More specifically, the screen printing apparatus 1 includes a squeegee 3 that is in sliding contact with the surface of the screen mask 11, and the pasty material supplied on the screen mask 11 is pushed out and printed on the workpiece 2 by conveying the squeegee 3 in a predetermined direction. Further, the screen printing apparatus 1 retreats the printed workpiece 2, and cleans the surface 11c of the screen mask 11 by conveying the cleaning unit 14 by the conveying means 15 from one end to the other end of the screen mask 11, for example, in an x-direction in FIG. 1 by the next printing step. As well, the alignment means in the screen printing apparatus 1 may be any means that detects the relative position between the workpiece 2 and the screen mask 11 with a camera for taking a picture of an alignment point provided on the workpiece 2 and aligns the stage 13 on the basis of the result of detection, or that can adjust the relative position between the workpiece 2 and the screen mask 11.

As well, for explanation, a conveying direction of the cleaning unit 14 is referred to as the x-direction, a direction parallel to the screen mask 11 and orthogonal to the x-direction is referred to as the y-direction, and a direction orthogonal to the screen mask 11 is referred to as the z-direction.

The workpiece 2 used in the screen printing apparatus 1 is a printing material, for example, a printed wiring board. The workpiece 2 is not limited to the printed wiring board, and may be any material that is suitable for printing that applies and transfers a pasty material or the like via the screen mask 11.

The screen mask 11 is formed by a sheet material 11a and a frame-shaped member 11b that surrounds and stretches the sheet material 11a, and is, for example, a metal mask having an aperture corresponding to a predetermined print pattern. This screen mask 11 is fixed by the screen support portion 12 to a predetermined position on the outer periphery of the print pattern.

The screen support portion 12 is a member that supports and fixes the frame-shaped member 11b of the screen mask 11.

The stage 13 is a table on which the workpiece 2 is fixed, and is able to be operated in the x-, y-, and z-directions by an unillustrated conveying mechanism. More specifically, as illustrated in FIG. 1, the stage 13 is operable in the x- and y-directions at a position separate from the screen mask 11 where the cleaning unit 14 is movable between the stage 13 and the screen mask 11, and is operable in the z-direction when the cleaning unit 14 has retreated from between the stage 13 and the screen mask 11, that is, when alignment of the workpiece 2 in the xy-plane is completed. Further, the stage 13 includes a holding mechanism that attracts and holds the workpiece 2 so that the workpiece 2 can be moved with movement of the stage 13. When the relative position between the screen mask 11 and the stage 13 is detected by the unillustrated alignment means and alignment is performed, the stage 13 operates in the x- and y-directions, and moves in the z-direction after the alignment in the x- and y-directions is completed. As well, the structure of the stage 13 is not limited to the structure in which the stage 13 operates in the z-direction after alignment in the xy plane is completed, and the stage 13 may move in the x-, y-, and z-directions after alignment.

As illustrated in FIGS. 1 to 7, the cleaning unit 14 includes cleaning paper 21 to contact the surface 11c of the screen mask 11, a scraper 22 that slides on the surface 11c of the screen mask 11 with the cleaning paper 21 being disposed therebetween, and a scraper moving means 23 that moves the scraper 22 to a slide position on the screen mask 11 and moves the scraper 22 from the slide position. These are attached to a main body portion 26 that is provided parallel to the y-direction and is shaped like a substantially rectangular parallelepiped. Further, the cleaning unit 14 includes a suction means 24 that sucks the adhering pasty material by sucking the surface 11c of the screen mask 11 with the cleaning paper 21 being disposed therebetween. The cleaning unit 14 further includes a solvent dropping means 25 that drops solvent onto the cleaning paper 21 in order to remove flux or the like adhering to the surface 11c of the screen mask 11 by the cleaning paper 21.

The cleaning paper 21 is brought into contact with the surface 11c of the screen mask 11 by the scraper 22 of the cleaning unit 14, and the cleaning unit 14 is conveyed in the x-direction on the xy-plane by the conveying means 15, whereby the residual pasty material adhering to the surface 11c of the screen mask 11 is removed for cleaning.

The cleaning paper 21 that contacts the surface 11c of the screen mask 11 is formed by a long nonwoven cloth that can catch the residual pasty material, such as solder cream or fine solid foreign substances, adhering to the surface 11c of the screen mask 11, and is wound in a roll. This cleaning paper 21 is wound around a feeding reel 27 and a take-up reel 28 provided in the main body portion 26, and is brought into contact with the surface 11c of the screen mask 11 by the scraper 22. The cleaning paper 21 is arranged to be supplied from the feeding reel 27 onto an upper surface 26a of the main body portion 26 opposing the surface 11c of the screen mask 11 and to be wound around the take-up reel 28. The feeding reel 27 and the take-up reel 28 provided in the main body portion 26 are caused by an unillustrated driving means to take up and feed the cleaning paper 21 to be wound.

The scraper 22 of the cleaning unit 14 is a blade-shaped member that extends parallel to the longitudinal direction of the main body portion 26, that is, extends in the y-direction. An upper end face 22a of the scraper 22 that contacts the cleaning paper 21 is provided with an uneven face portion 22b formed by irregularities. The uneven face portion 22b of the scraper 22 is formed by linear convex ribs or concave grooves extending in the longitudinal direction of the upper end face 22a. A plurality of linear convex ribs or concave grooves are provided on the upper end face 22a.

Figure 3:
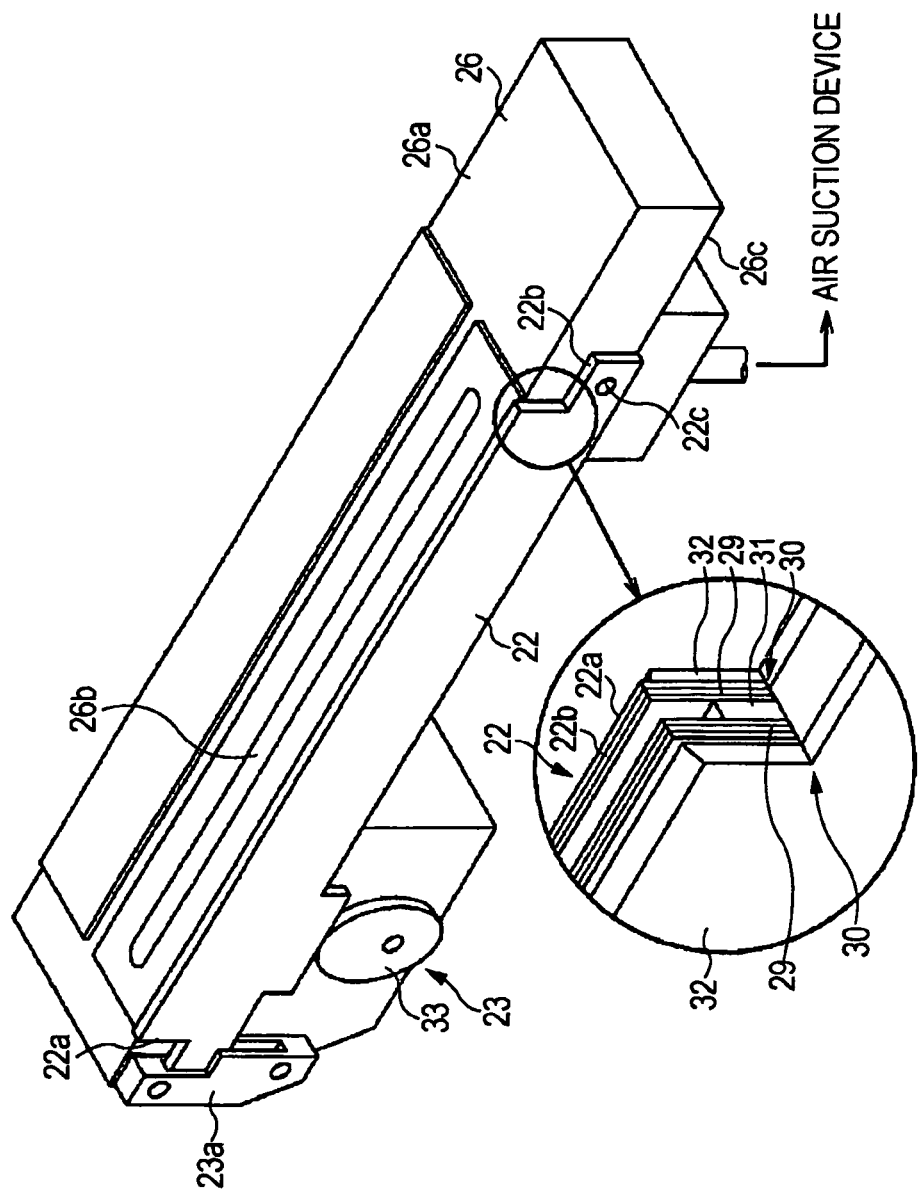
FIG. 3 is a perspective view of the cleaning unit.
Figure 7:
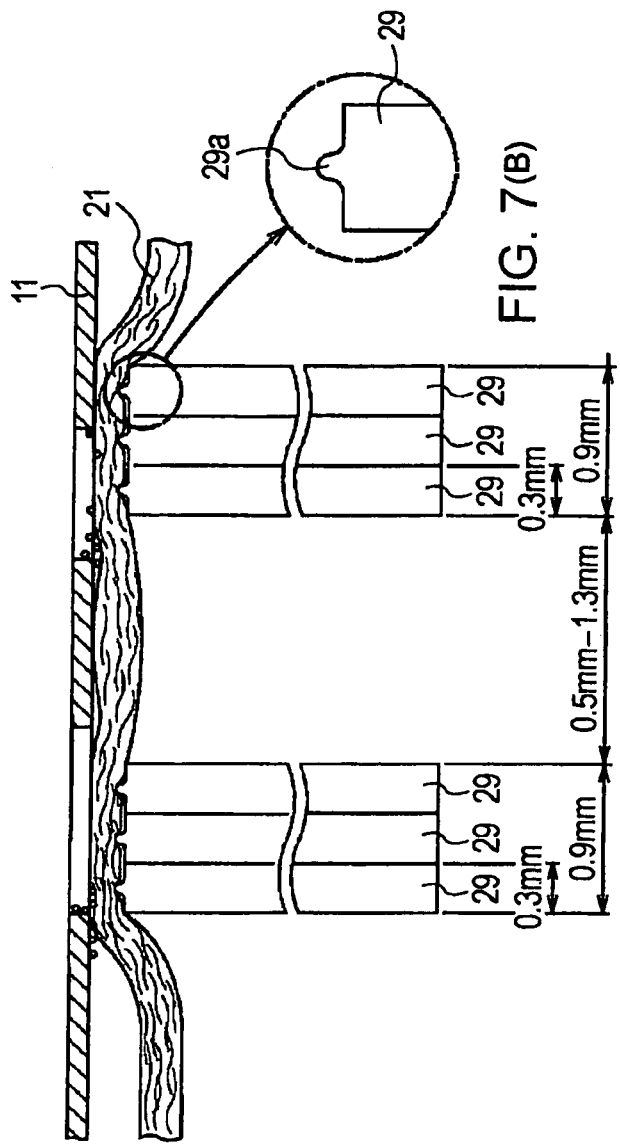
FIG. 7 is an enlarged plan view of the principal parts of plate-shaped members in the scraper.

More specifically, as illustrated in FIGS. 3 and 7, the scraper 22 is formed by stacking a plurality of plate-shaped members 29 in parallel in the x-direction serving as the slide direction. For example, the plate-shaped members 29 of the scraper 22 are formed by flexible plates, such as steel thin plates, each having a thickness of about 0.3 mm. Further, at upper ends in the height direction (z-direction) to contact the cleaning paper 21, the plate-shaped members 29 have ribs 29a that have a width smaller than the thickness of the plate-shaped members 29 and that reliably contact the cleaning paper 21. By stacking a plurality of plate-shaped members 29 having the ribs 29a, the uneven face portion 22b of the scraper 22 is formed. Further, in the scraper 22, two units 30, each of which is formed by three plate-shaped members 29 arranged in parallel in the slide direction (x-direction) on the surface 11c of the screen mask 11, are juxtaposed to be spaced a predetermined distance of, for example, 0.5 to 1.3 mm from each other in the x-direction by a spacer 31. The spacer 31 is formed by a plate-shaped member having a thickness of about 0.5 to 1.3 mm and a height sufficiently smaller than the height of the plate-shaped members 29. Also, the spacer 31 is provided at lower ends of the plate-shaped members 29 in the height direction (z-direction) in a manner such that the plate-shaped members 29 can bend at upper ends thereof. Further, the two units 30 of the scraper 22 arranged with the spacer 31 being disposed therebetween are clamped by plate-shaped members 32 that are formed of resin or the like and are lower than the plate-shaped members 29.

The scraper 22 is fixed to one side face of the main body portion 26 in a manner such as to be movable up and down, is moved by the scraper moving means 23 to a contact position to contact the surface 11c of the screen mask 11 with the cleaning paper 21 being disposed therebetween, and is brought into sliding contact with the surface 11c of the screen mask 11 in the x-direction by the conveying means 15, thereby cleaning the surface 11c of the screen mask 11. In this case, the scraper 22 is slid while the convex ribs on the uneven face portion 22b of the scraper 22, that is, the ribs 29a of the plate-shaped members 29 reliably press the cleaning paper 21 against the surface 11c of the screen mask 11. Hence, the residual pasty material or the like adhering to the surface 11c of the screen mask 11 can be reliably caught by the cleaning paper 21. Moreover, since the contact area of the scraper 22 with the cleaning paper 21 is small, high-speed sliding can be realized, and the amount of cleaning paper 21 to be used in one cleaning step can be reduced.

Further, in the scraper 22, the two units 30 are spaced the predetermined distance from each other by the spacer 31. Thus, a linear contact state with the cleaning paper 21 can be maintained, and slidability that realizes high-speed cleaning can be ensured while enhancing the cleaning performance.

In the scraper 22 formed by the plate-shaped members 29, the plate-shaped members 29 can independently bend at the upper ends in the height direction (z-direction). Thus, when the scraper 22 is slid by the conveying means 15, the brushing effect improves scraping of the residual pasty material.

While the two units 30, each of which is formed by stacking a plurality of plate-shaped members 29 in parallel in the slide direction, are spaced in the above-described scraper 22, alternatively, only one unit 30 may be provided.

Further, while one unit 30 is formed by stacking a plurality of plate-shaped members 29, the scraper 22 may be formed by a blade-shaped member having an uneven face portion 22b, as illustrated in FIG. 8(A). Further, as illustrated in FIG. 8(B), cuts 22c with a predetermined depth may be formed between adjacent ribs on the uneven face portion 22b illustrated in FIG. 8(A) as if a plurality of plate-shaped members 29 illustrated in FIG. 3 were stacked at an upper end face 22a, thereby providing a bending function like the plate-shaped members 29. In addition, when the scraper 22 is formed by stacking a plurality of plate-shaped members 29, instead of forming the ribs 29a at the upper ends of the plate-shaped members 29, a plurality of plate-shaped members 29 having upper ends formed by pointed ribs 29b may be stacked, as illustrated in FIG. 8(C).

The scraper 22 preferably has a flexibility similar to or more than that of the screen mask 11. Also, the scraper 22 is preferably arc-shaped such that about the center thereof in the longitudinal direction orthogonal to the conveying direction (x-direction) of the cleaning unit 14, that is, in the y-direction protrudes toward the screen mask 11 (see FIG. 8(D)). By thus being arc-shaped, the scraper 22 can be brought into contact with even a portion near the center of the screen mask 11 that bends most, and this provides a cleaning effect.

As illustrated in FIG. 4, the scraper moving means 23 includes an eccentric cam 33 that raises and lowers one end portion 22d of the scraper 22 in the longitudinal direction (y-direction), and a cam driving means 33a that rotates the eccentric cam 33. The scraper 22 to be raised and lowered by the scraper moving means 23 is pivoted up and down on a pivot shaft 22f provided at the other end portion 22e in the longitudinal direction.

The eccentric cam 33 of the scraper moving means 23 is rotatably attached to the side face of the main body portion 26 where the scraper 22 is provided and below the one end portion 22d of the scraper 22. The eccentric cam 33 is rotated by the cam driving means 33a formed by, for example, a motor while being in slide contact with a lower end of the scraper 22 in the height direction (z-direction), and pivots the scraper 22 on the pivot shaft 22f so that the scraper 22 moves down and up between a down state illustrated in FIG. 5(A) and an up state illustrated in FIG. 5(B). The scraper moving means 23 moves the scraper 22 up and down so that the plate-shaped members 29 of the scraper 22 are located in contact with the surface 11c of the screen mask 11 with the cleaning paper 21 being disposed therebetween when the scraper 22 is in the up state, as illustrated in FIG. 5(B). Further, the scraper moving means 23 moves the scraper 22 up and down so that the upper end of the scraper 22 faces above the upper surface 26a of the main body portion 26, that is, toward the screen mask 11 when the scraper 22 is at the up position. This allows only the scraper 22 to slide on the surface 11c of the screen mask 11 during cleaning.

As illustrated in FIG. 4(B), the scraper moving means 23 includes a regulation piece 23a that regulates the up-down position of the scraper 22. The regulation piece 23a has an opening 23b in which the one end portion 22d of the scraper 22 is inserted. The one end portion 22d of the scraper 22 contacts an upper end and a lower end of the opening 23b, whereby the regulation piece 23a regulates the pivot amount of the scraper 22.

As well, the scraper moving means 23 is not limited to the mechanism in which the scraper 22 is moved up and down by rotation of the eccentric cam 33. For example, a cylinder motor may be provided instead of the eccentric cam 33, and the scraper 22 may be moved up and down by driving of the cylinder motor. Further, the scraper moving means 23 is not limited to the structure in which the eccentric cam 33 is provided at the one end portion 22d of the scraper 22, and the eccentric cam 33 may be close to the pivot shaft 22f.

The suction means 24 is connected to an unillustrated air suction device via a suction pipe 24a provided in the main body portion 26. The suction pipe 24a of the suction means 24 is coupled on the upper surface 26a of the main body portion 26 to an aperture 26b that is provided close to the scraper 22 in the slide direction (x-direction) and parallel to the longitudinal direction of the scraper 22. Suction is performed via the aperture 26b.

The aperture 26b faces the surface 11c of the screen mask 11 with the cleaning paper 21 being disposed therebetween. For this reason, the suction means 24 sucks the cleaning paper 21, and holds the residual pasty material adhering to the cleaning paper 21.

As illustrated in FIG. 1, the solvent dropping means 25 is a dropping device that drops solvent onto the cleaning paper 21 at a position where the cleaning unit 14 recedes from below the screen mask 11 while the cleaning unit 14 does not perform cleaning. Solvent to be dropped by the solvent dropping means 25 is a solvent that can solve foreign materials, such as flux, adhering to the surface 11c of the screen mask 11, for example, IPA (isopropyl alcohol) or stencil cleaner.

The solvent dropping means 25 is not limited to the above-described means that drops the solvent at the receding position of the cleaning unit 14, and for example, may be attached to the main body portion 26 so as to impregnate the cleaning paper 21 with solvent.

As well, in the cleaning unit 14, as described above, the plate-shaped members 29 of the scraper 22 may make an inclined contact with respect to the direction (y-direction) orthogonal to the slide direction on the surface 11c of the screen mask 11. Further, the plate-shaped members 29 of the scraper 22 may contact the surface 11c of the screen mask 11 while the longitudinal direction thereof is inclined with respect to the x-direction serving as the conveying direction of the cleaning unit 14. The inclination angles of the scraper 22 with respect to the x-direction and the y-direction may be any angles that can efficiently remove the residual pasty material adhering to the surface 11c of the screen mask 11, and differ according to, for example, the flexibility of the screen mask 11, the conveying speed of the cleaning unit 14, and the material and viscosity of the pasty material to be used.

Figure 6:
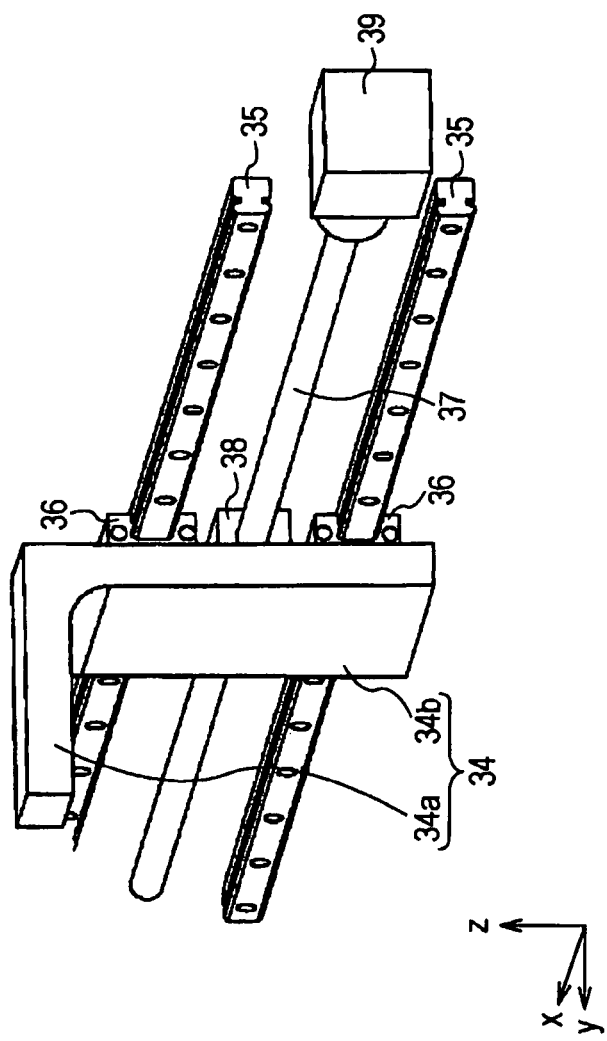
FIG. 6 is a perspective view of a conveying means.

As illustrated in FIGS. 1 and 6, the conveying means 15 for conveying the cleaning unit 14 in the x-direction includes, at a side of a bottom surface 26c of the main body portion 26 where the pivot shaft 22f is rotatably supported, a support bracket 34 that supports the main body portion 26, a pair of guide rails 35 and 35 that extend in the x-direction and are arranged in the z-direction on an unillustrated base in the screen printing apparatus 1, slider members 36 and 36 to which the guide rails 35 and 35 are slidably attached, a lead screw 37, a nut member 38 rotatably supported on the lead screw 37 so as to couple the lead screw 37 to the support bracket 34, and a servomotor 39 coupled to one end of the lead screw 37 so as to rotate the lead screw 37.

The support bracket 34 is a member of substantially L-shaped cross section that includes a plate-shaped member 34a provided on the xy-plane and a plate-shaped member 34b provided on the xz-plane. The support bracket 34 is fixed to the main body portion 26 at the plate-shaped member 34a. Further, the plate-shaped member 34b of the support bracket 34 is provided with a pair of slider members 36 and 36 having a substantially angular U-shaped cross section.

The guide rails 35 and 35 are a pair of guide members extending in the x-direction serving as the conveying direction of the cleaning unit 14. The slider members 36 and 36 are attached to the guide rails 35 and 35, and the slider members 36 and 36 slide.

The lead screw 37 is coupled to the support bracket 34 by the nut member 38, and is rotated by driving the servomotor 39 so as to convey the support bracket 34 in the x-direction. The servomotor 39 is subjected to servo control according to a control signal from the control means 16 so as to move the support bracket 34 to a desired position.

As well, while the conveying means 15 supports the main body portion 26 of the cleaning unit 14 in a so-called cantilevered manner, the conveying means 15 may be a mechanism in which a pair of support brackets 34 are arranged in the y-direction so that the main body portion 26 is supported in a so-called dual support manner. Besides performing conveyance with the lead screw 37, as described above, the conveying means 15 may perform conveyance with any known conveying means.

The control means 16 is a means that controls the entire screen printing apparatus 1, and more specifically, controls the timing and so on in steps of conveyance of the squeegee 3, driving and conveyance of the cleaning unit 14, and conveyance of the stage 13.

Figure 9:
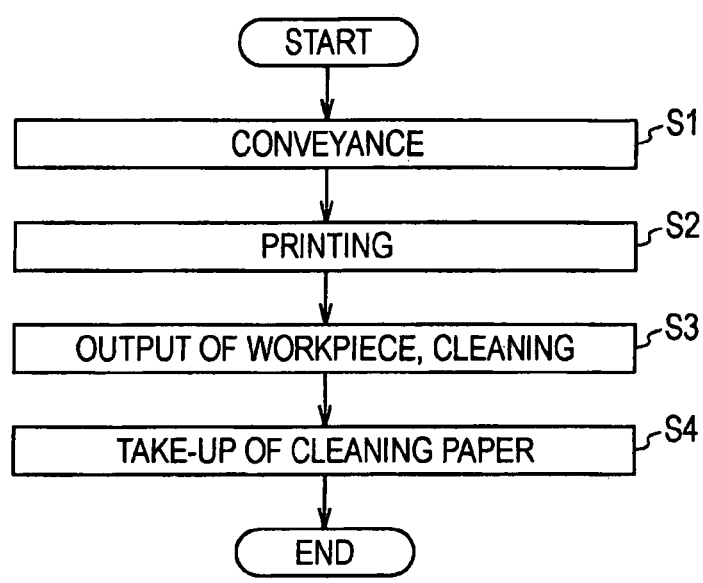
FIG. 9 is a flowchart explaining the operation of the screen printing apparatus.
Figure 11:
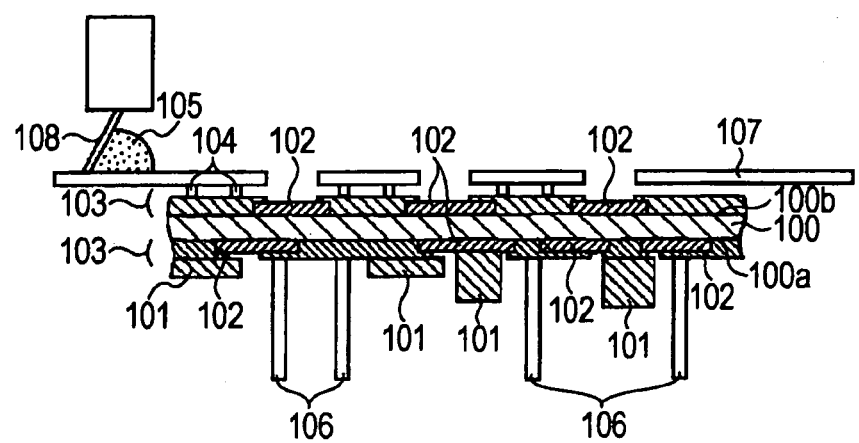
FIG. 11 is a cross-sectional view of a substrate explaining exudation in screen printing.

Next, the operation of the screen printing apparatus 1 thus configured will be described with reference to a flowchart of FIG. 9.

First, in Step S1, the control means 16 sets a workpiece 2 on the stage 13, and conveys the stage 13 to a position opposing the screen mask 11 while controlling a conveying means for the stage 13 in the xy-plane.

Next, in Step S2, the control means 16 conveys the stage 13, which has been aligned in the xy-plane, in the z-direction while controlling a conveying means for the stage 13 in the z-direction so as to bring the workpiece 2 into tight contact with the screen mask 11, and slides the squeegee 3 on the surface of the screen mask 11 so as to transfer and print the pasty material onto the workpiece 2.

Next, in Step S3, the control means 16 conveys the stage 13, and removes the printed workpiece 2 from the stage 13. In this case, the control means 16 retreats the stage 13, and also controls the scraper moving means 23 so as to bring the scraper 22 into contact with the surface 11c of the screen mask 11 with the cleaning paper 21 being disposed therebetween. Further, the control means 16 controls the conveying means 15 so as to convey the cleaning unit 14 in the conveying direction (x-direction) and to slide the scraper 22 on the surface 11c of the screen mask 11, thereby catching the residual pasty material adhering to the surface 11c of the screen mask 11.

As well, in the screen printing apparatus 1, when conveyance in the x-direction is performed by the conveying means 15, the suction means 24 may be driven to suck the residual pasty material adhering to the surface 11c of the screen mask 11. Further, in the screen printing apparatus 1, prior to driving of the conveying means 15, the solvent dropping means 25 may be controlled to drop solvent onto the cleaning paper 21.

Finally, in Step S4, the control means 16 controls the feeding reel 27 and the take-up reel 28 so as to take up the cleaning paper 21 opposing the scraper 22, and then finishes one printing tact.

By repeating the above-described steps, the control means 16 can perform screen printing on the workpiece 2.

Next, a description will be given of the relationship between the cleaning speed and the print quality in the screen printing apparatus 1. FIG. 10 shows the relationship between the cleaning speed and the cleanness of the screen mask 11 in the screen printing apparatus 1. Here, the clearing speed on the horizontal axis in FIG. 10 represents the conveying speed of the conveying means 15. The cleanness on the vertical axis represents the measured number of particles per unit area in the solder paste remaining on the surface 11c of the screen mask 11 when cleaning is performed using the screen printing apparatus 1. Further, as the cleaning unit 14, the scraper 22 illustrated in FIG. 7 was used in which two units 30, each formed by stacking three plate-shaped members 29 having a width of 0.3 mm, were spaced 1.3 mm apart from each other. Further, cleaning was performed using, as the cleaning paper 21, papers formed by continuous filament nonwoven cloths (Bemliese TF307 (from Asahi Kasei Corporation)) having two fiber densities of 30 g/m$^2$ and 60 g/m$^2$ and different thicknesses at the same fiber density.

The measurement result in FIG. 10 shows that a fixed cleaning speed is necessary to maintain high quality in the cleaning unit 14 of the screen printing apparatus 1, regardless of the condition of the cleaning paper 21. More specifically, when the quality such that the cleanness is 5 particles per square millimeter or less is maintained, a conveying speed of about 150 to 250 mm/s can be realized.

This shows that the cleaning unit 14 of the screen printing apparatus 1 maintains high quality and realizes high-speed cleaning.

In the above-described screen printing apparatus 1, cleaning can be performed with the cleaning unit 14 at high speed, and therefore, cleaning can be performed within, for example, a time when the workpiece 2 is retreated after printing. Hence, cleaning can be performed within one printing tact, that is, cleaning can be performed each time without any loss of tact time.

Further, since cleaning can be performed each time in the screen printing apparatus 1, as described above, it is possible to maintain high quality and to constantly stabilize the print quality.

In addition, since the scraper 22 of the cleaning unit 14 brings the cleaning paper 21 into contact with the surface 11c of the screen mask 11 in the screen printing apparatus 1, the amount of paper to be used in one cleaning operation can be reduced, and this is economical.

The above-described screen printing apparatus 1 is just an embodiment, and can, of course, be used in various embodiments without departing from the scope of the present invention.

For example, in the screen printing apparatus 1, a plurality of scrapers 22 may be arranged in the conveying direction in the cleaning unit 14. This allows reliable scraping of the residual pasty material that cannot be scraped off with only one scraper.

The invention claimed is:

1. A cleaning device comprising:
a cleaning unit that cleans one surface of a screen mask opposing a workpiece, the screen mask having a print pattern for printing a pattern on the workpiece; and
conveying means that conveys the cleaning unit from one end to the other end of the surface of the screen mask in a longitudinal direction,
wherein the cleaning unit includes:
   cleaning paper that contacts the surface of the screen mask,
   a box-shaped main body portion having a flat front end wall facing towards the one end and a flat rear end wall facing towards the other end, the front end wall and the rear end wall extending parallel to one another and perpendicularly relative to the longitudinal direction in a widthwise direction across the screen mask;
   a scraper assembly that brings the cleaning paper into contact with the surface of the screen mask, the scraper assembly including:
      a flat scraper blade operative to slide from the one end to the other end on the surface of the screen mask with the cleaning paper being disposed therebetween, the scraper blade having an uneven scraping end portion,
      scraper moving means that moves the scraper blade to and between a contact position where the scraper blade is urged against the cleaning paper which, in turn, is caused to contact the surface of the screen mask and a retract position where the scraper blade is removed from contact with the cleaning paper, the scraper moving means operatively connected to the rear end wall of the box-shaped main body portion and
      suction means disposed in the box-shaped main body portion adjacent the rear end wall, the suction means operative to suck the surface of the screen mask via the cleaning paper,
wherein the scraper blade and the rear end wall are facially juxtaposed and the scraper blade is pivotably connected at one end portion of the rear end wall in the widthwise direction and the scraper moving means is operably connected to the rear end wall at an opposite end portion of the rear end wall in the widthwise direction such that, when energized, the scraper moving means causes the scraper blade to pivot from the retract position and to the contact position and to pivot from the contact position to the retract position.

2. The cleaning device according to claim 1 wherein the scraper blade includes a plurality of the units, and the units are arranged in parallel at a predetermined distance from each other in the longitudinal direction on the surface of the screen mask.

3. The cleaning device according to claim 1, further comprising cleaning-liquid dropping means that drops cleaning liquid onto the cleaning paper.

4. The cleaning device according to claim 1, wherein the scraper moving means includes a cam element in contact with the scraper blade, the cam element facially opposing and positioned adjacent the rear end wall.

5. The cleaning device according to claim 4, wherein the scraper moving means includes rotation means that rotates the cam element in order to move the scraper blade to and between the retract position and the contact position.

* * * * *